United States Patent [19]

Tomioka

[11] Patent Number: 5,668,756
[45] Date of Patent: Sep. 16, 1997

[54] MULTI-VALUE LEVEL TYPE NON-VOLATILE SEMICONDUCTOR MEMORY UNIT AND METHOD OF REWRITING THE SAME

[75] Inventor: Yugo Tomioka, Tokyo, Japan

[73] Assignee: Nippon Steel Corporation, Tokyo, Japan

[21] Appl. No.: 576,086

[22] Filed: Dec. 21, 1995

[30] Foreign Application Priority Data

Dec. 26, 1994 [JP] Japan ................... 6-337223

[51] Int. Cl.$^6$ ............................. G11C 11/34
[52] U.S. Cl. .................. 365/185.03; 365/185.24; 365/185.29
[58] Field of Search ............ 365/185.03, 185.29, 365/185.14, 185.24

[56] References Cited

U.S. PATENT DOCUMENTS 5,043,940  8/1991  Harari ................... 365/185.03
5,379,256  1/1995  Tanaka et al. ........... 365/185.24

OTHER PUBLICATIONS

1992, Autumnal 53rd Convention Report of the Japan Society of Applied Physics, p. 653.

*Primary Examiner*—David C. Nelms
*Assistant Examiner*—F. Niranjan
*Attorney, Agent, or Firm*—Pollock, Vande Sande & Priddy

[57] ABSTRACT

A non-volatile semiconductor memory unit comprises a memory cell having a semiconductor substrate, a control gate formed over the semiconductor substrate, an electric charge accumulative layer formed between the semiconductor substrate and the control gate, and a source and drain, both formed in the semiconductor substrate. The memory cell stores N-valued data (N being an integer more than 3) by accumulating an electric charge in the electric charge accumulative layer. A detector is provided for detecting a storage state before data rewrite of the memory cell. A comparison circuit compares the storage state before data rewrite, with a storage state after data rewrite to produce a difference therebetween. A rewrite circuit is included for rewriting the storage state of the memory cell by applying N–1 levels of predetermined voltages to the source, the drain and control gate of the memory cell, respectively, in accordance with the produced difference.

27 Claims, 6 Drawing Sheets

MULTI-VALUE LEVEL TYPE NON-VOLATILE SEMICONDUCTOR MEMORY UNIT AND METHOD OF REWRITING THE SAME

FIELD OF THE INVENTION

The present invention relates to a non-volatile semiconductor memory unit and to a method of rewriting the same. More particularly, it relates to a multi-value level type non-volatile semiconductor memory unit in which tertiary or more data (more than three values data) is stored in a single memory cell and a method of rewriting this type of memory unit.

BACKGROUND OF THE INVENTION

To increase the memory capacity of the non-volatile semiconductor memory unit such as an EEPROM (Electrically Erasable and Programmable Read Only Memory) and an electrically collectively erasable flash memory, a so-called multi-value level type has been proposed in which tertiary or more data is stored in a single memory cell (1992, Autumnal 53rd Convention Report of the Japan Society of Applied Physics, page 653)

The above report, however, proposes only a method of storing data in the multi-value level type non-volatile semiconductor memory unit and does not propose a method of rewriting stored data.

SUMMARY OF THE INVENTION

An object of the present invention is to provide a multi-value level type non-volatile semiconductor memory unit capable of performing accurate data rewriting and a method for rewrite of this type of memory unit.

Another object of the present invention is to provide a multi-value level type non-volatile semiconductor memory unit capable of increasing the number of possible rewriting operations and a method for rewrite of this type of memory unit.

A first embodiment of a non-volatile semiconductor memory unit according to the present invention comprises:

a memory cell having a semiconductor substrate, a control gate formed over the semiconductor substrate, and an electric charge accumulative layer formed between the semiconductor substrate and the control gate, the memory cell storing tertiary or more data by accumulating electric charge in the electric charge accumulative layer;

data erase means for erasing data stored in the memory cell; and data rewrite means for storing tertiary or more write data in the memory cell by accumulating electric charge, an amount of which corresponds to a value of the write data, in the electric charge accumulative layer of the memory cell at which the stored data is erased by the data erase means.

A second embodiment of a non-volatile semiconductor memory unit according to the present invention comprises:

a memory cell having a semiconductor substrate, a control gate formed over the semiconductor substrate, an electric charge accumulative layer formed between the semiconductor substrate and the control gate, and a source and drain both formed in the semiconductor substrate, the memory cell storing tertiary or more data by accumulating electric charge in the electric charge accumulative layer;

detection means for detecting a storage state before data rewrite of the memory cell;

comparison means for comparing the storage state before data rewrite, which is detected by the detection means, with a storage state after data rewrite to produce a difference between the storage state before data rewrite and the storage state after data rewrite; and rewrite means for rewriting the storage state of the memory cell by applying predetermined voltages to the source, the drain and the control gate of the memory cell, respectively, in accordance with the difference produced in the comparison means.

A first method of rewriting a non-volatile semiconductor memory unit according to the present invention, the non-volatile semiconductor memory unit comprising a memory cell which has a semiconductor substrate, a control gate formed over the semiconductor substrate, and an electric charge accumulative layer formed between the semiconductor substrate and the control gate, the memory cell storing tertiary or more data by accumulating electric charge in the electric charge accumulative layer;

the method comprises the steps of;

erasing data stored in the memory cell; and storing tertiary or more write data in the memory cell by accumulating electric charge, an amount of which corresponds to a value of the write data, in the electric charge accumulative layer of the memory cell at which the stored data is erased.

A second method of rewriting a non-volatile semiconductor memory unit according to the present invention, the non-volatile semiconductor memory unit comprising a memory cell which has a semiconductor substrate, a control gate formed over the semiconductor substrate, an electric charge accumulative layer formed between the semiconductor substrate and the said control gate, and a source and drain both formed in the semiconductor substrate, the memory cell storing tertiary or more data by accumulating electric charge in the electric charge accumulative layer;

the method comprises the steps of:

detecting a storage state before data rewrite of the memory cell;

comparing the storage state before data rewrite, which is detected by the detection means, with a storage state after data rewrite to produce a difference between the storage state before data rewrite and the storage state after data rewrite; and rewriting the storage state of the memory cell by applying predetermined voltages to the source, the drain and the control gate of the memory cell, respectively, in accordance with the produced difference.

A third embodiment of a non-volatile semiconductor memory unit according to the present invention comprises a memory cell having a semiconductor substrate, a control gate formed over the semiconductor substrate and an electric charge accumulative layer formed between the semiconductor substrate, the control gate, and a source and drain both of which are formed in the semiconductor substrate, the memory cell storing tertiary or more data by accumulating electric charge in the electric charge accumulative layer;

data erase means for erasing data stored in the memory cell; and rewrite means for rewriting a storage state of the memory cell by applying predetermined voltages, which correspond to a value of tertiary or more write data, to the source, the drain and the control gate of the memory cell, respectively, at which the stored data is erased by the data erase means.

A fourth embodiment of a non-volatile semiconductor memory unit according to the present invention comprises:

a memory cell having a semiconductor substrate, a control gate formed over the semiconductor substrate, and an electric charge accumulative layer formed between the semiconductor substrate and the control gate, the memory cell storing tertiary or more data by accumulating electric charge in the electric charge accumulative layer;

detection means for detecting a storage state before data rewrite of the memory cell;

comparison means for comparing the storage state before data rewrite, which is detected by the detection means, with a storage state after data rewrite to produce a difference between the storage state before data rewrite and the storage state after data rewrite; and rewrite means for rewriting the storage state of the memory cell by increasing or decreasing an amount of electric charge accumulated in the electric charge accumulative layer, in accordance with the difference produced in the comparison means.

In the first and the third non-volatile semiconductor memory units of the present invention and the first method of rewriting the non-volatile semiconductor memory unit of the present invention, the write data is stored in the memory cell by accumulating the electric charge corresponding to the value of tertiary or more write data in the electric charge accumulative layer of the memory cell at which the stored data is once erased. Therefore, they can perform accurate data rewrite.

In the second and the fourth non-volatile semiconductor memory units of the present invention and the second method of rewriting the non-volatile semiconductor memory unit of the present invention, the storage state of the memory cell is rewritten by applying the voltages to the source, drain and control gate of the memory cell on the basis of the result of comparison of the detected storage state before data rewrite with the storage state after data rewrite. Therefore, they need not erase the storage state of the memory cell each time the rewrite operation is carried out. Consequently, the amount of current passing through a tunnel insulating film can be decreased to a necessary minimum to suppress deterioration of the tunnel insulating film, for example, thereby increasing the number of possible rewrite operations.

DESCRIPTION OF THE PREFERRED EMBODIMENTS

Figure 1:
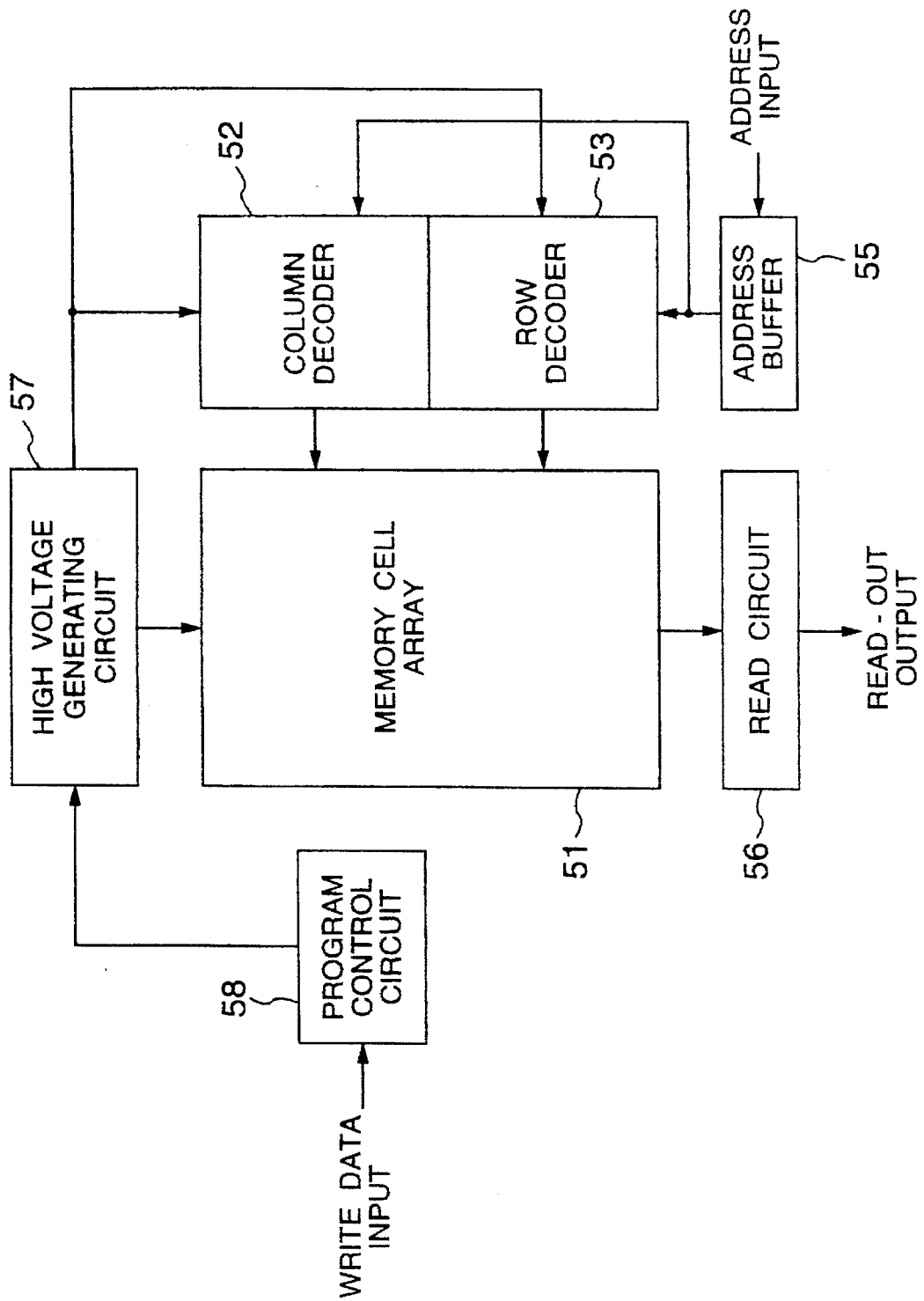
FIG. 1 is a block diagram showing the construction of a floating gate type flash memory according to a first embodiment of a non-volatile semiconductor memory unit of the present invention.

Referring to FIG. 1, a floating gate type flash memory according to a first embodiment of a non-volatile semiconductor memory unit of the present invention comprises a memory cell array 51, a column decoder 52, a row decoder 53, an address buffer 55, a read circuit 56, a program control circuit 58 and a high voltage generating circuit 57.

Figure 2:
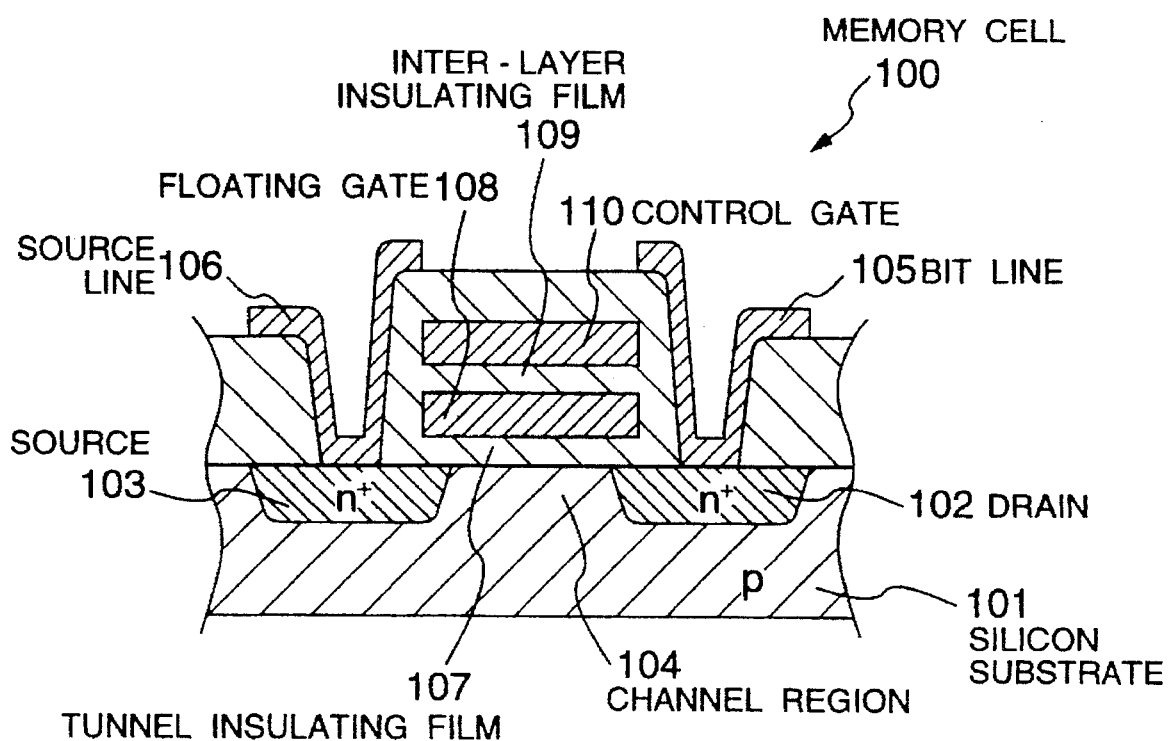
FIG. 2 is a schematic sectional view showing a structure of a memory cell used in the flash memory shown in FIG. 1.
Figure 3:
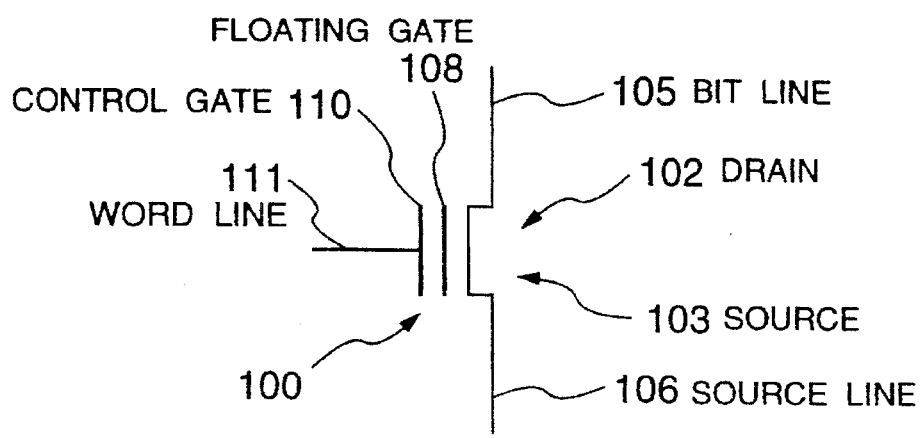
FIG. 3 is an equivalent circuit diagram showing the connection state of the memory cell shown in FIG. 2.

In the memory cell array 51, memory cells 100, each of the type illustrated in FIGS. 2 and 3, are arranged in a matrix. In the memory cell 100, a drain 102 and a source 103 which are n-type impurity diffused layers are formed in a surface region of a p-type silicon substrate 101, as shown in FIG. 2, and a channel region 104 is formed between the drain 102 and the source 103. A bit line 105 is electrically connected to the drain 102 and a source line 106 is electrically connected to the source 103. A tunnel insulating film 107, which is a $SiO_2$ film having a thickness of about 10 nm, is formed on the channel region 104. A floating gate 108 made of low resistivity polysilicon, an interlayer insulating film 109 and a control gate 110 made of low resistivity polysilicon are formed sequentially over the tunnel insulating film 107. Illustrated in FIG. 3 is a connection diagram of the memory cell 100. Reference numerals in FIG. 3 correspond to those in FIG. 2.

The high voltage generating circuit 57 generates voltages to be applied to the bit line 105, source line 106 and word line 111 of the memory cell 100, respectively. The row decoder 53 selects a word line 111 of the memory cell array 51 in accordance with an address input supplied through the address buffer 55 and applies the voltage from the high voltage generating circuit 57 to the selected word line 111. The column decoder 52 selects a bit line 105 of the memory cell array 51 in accordance with the address input supplied from the address buffer 55 and applies the voltage from the high voltage generating circuit 57 to the selected bit line 105. The source line 106 of each memory cell 100 is supplied with the voltage from the high voltage generating circuit 57. The read circuit 56 reads storage data of a selected memory cell 100 in the memory cell array 51. In the read mode, the read circuit 56 reads out the read storage data and delivers it to the outside. The program control circuit 58 controls the high voltage generating circuit 57 in the rewrite mode to generate the voltages to be applied to the bit line 105, the source line 106 and the word line 111 of the selected memory cell 100, respectively. The high voltage generating circuit 57 generates the aforementioned voltages under the control of the program control circuit 58 and supplies them to the column decoder 52, the row decoder 53 and the bit line 105 of the memory cell array 51, respectively.

The row decoder 53 also responds to the output signal of the high voltage generating circuit 57 to ground the selected word line 111. The column decoder 52 also responds to the output signal of the high voltage generating circuit 57 to open the selected bit line 105. Under the control of the program control circuit 58, the high voltage generating circuit 57 also opens the source line 106 of each memory cell 100.

Next, a method of writing quaternary data of "00" to "11" in the memory cell 100 shown in FIG. 2 and a method of reading the quaternary data stored in the memory cell 100 will be described.

For example, when data "11" is written in the memory cell 100, the write data "11" is inputted to the program control circuit 58 from the outside. The program control circuit 58 controls the high voltage generating circuit 57 to cause it to ground the bit line 105 of the memory cell 100, open the source line 106 of the memory cell 100 and apply a pulse voltage of about 10 to 15 volts to the control gate 110 of the memory cell 100 through the word line 111. Through this, potential is induced on the floating gate 108 of the memory cell 100 and electric charge of a predetermined amount complying with a potential difference between the floating gate 108 and the drain 102 is injected from a portion of silicon substrate 101 near the drain 102 to the floating gate 108 under the influence of Fowler-Nordheim (FN) tunnelling. As a result, the threshold value of the memory cell 100 is raised to about 7 volts to permit the write data "11" to be written in the memory cell 100. When write data "10" is written in the memory cell 100, the program control circuit 58 controls the high voltage generating circuit 57 to apply a voltage of 1 volt to the bit line 105 of the memory cell 100, open the source line 106 of the memory cell 100 and apply a pulse voltage of about 10 to 15 volts to the control gate 110 of the memory cell 100 through the word line 111. Through this, the threshold value of the memory cell 100 is set to 5 volts to permit the write data "10" to be written in the memory cell 100. When write data "01" is written in the memory cell 100, the program control circuit 58 controls the high voltage generating circuit 57 to apply a voltage of 2 volts to the bit line 105 of the memory cell 100, open the source line 106 of the memory cell 100 and apply a pulse voltage of about 10 to 15 volts to the control gate 110 through the word line 111. Through this, the threshold value of the memory cell 100 is set to 3 volts to permit the write data "01" to be written in the memory cell 100. When write data "00" is written in the memory cell 100, the program control circuit 58 controls the high voltage generating circuit 57 to apply a voltage of 3 volts to the bit line 105 of the memory cell 100, open the source line 106 of the memory cell 100 and apply a pulse voltage of about 10 to 15 to the control gate 110 of the memory cell 100 through the word line 111. Through this, the threshold value of the memory cell 100 is set to 1 volt to permit the write data "00" to be written in the memory cell 100.

When the data thus stored in the memory cell 100 is read, the program control circuit 58 controls the high voltage generating circuit 57 to apply a voltage of 1 volt to the bit line 105 of the memory cell 100, render potential on the source line 106 of the memory cell 100 at 0 (zero) volt, and sequentially apply 2 volts, 4 volts and 6 volts to the control gate 110 of the memory cell 100 through the word line 111. When a current flows between the source 103 and the drain 102 under the application of the voltage of 2 volts to the control gate 110, the read circuit 56 determines that the threshold value of the memory cell 100 at that time is 1 volt and delivers the "00" data. When no current flows between the source 103 and the drain 102 under the application of the voltage of 2 volts to the control gate 110 but a current flows between the source 103 and the drain 102 under the application of the voltage of 4 volts to the control gate 110, the read circuit 56 determines that the threshold value of the memory cell 100 at that time is 3 volts and delivers the "01" data. When no current flows between the source 103 and the drain 102 under the application of voltages of 2 volts and 4 volts to the control gate 110 but a current flows between the source 103 and the drain 102 under the application of the voltage of 6 volts to the control gate 110, the read circuit determines that the threshold value of the memory cell 100 at that time is 5 volts and delivers the "10" data. When no current flows between the source 103 and the drain 102 even under the application of the voltage of 6 volts to the control gate 110, the read circuit 56 determines that the threshold value of the memory cell 100 at that time is 7 volts and delivers the "11" data.

Next, a method of erasing the data stored in the memory cell 100 will be described.

When the data stored in the memory cell 100 is erased, the program control circuit 58 controls the high voltage generating circuit 57 to open the bit line 105 of the memory cell 100, apply a pulse voltage of high voltage (12 volts) to the source line 106 of the memory cell 100 and ground the control gate 110 of the memory cell 100 through the word line 111. Through this, electric charge is drawn out of the floating gate 108 of the memory cell 100 under the influence of FN tunnelling to cause the memory cell 100 to assume an electrical erase level (a storage state for data "00"), with the result that the data stored in the memory cell 100 is erased. This erase operation can be completed within substantially the same interval of time regardless of which data the memory cell 100 stores.

The subsequent write operation of data "00" is carried out by the aforementioned erase operation (typically, the aforementioned write operation of data "00" is executed when the ultraviolet-ray erase level is changed to the storage state for data "00" upon delivery of products or after ultraviolet-ray erase).

Figure 4:
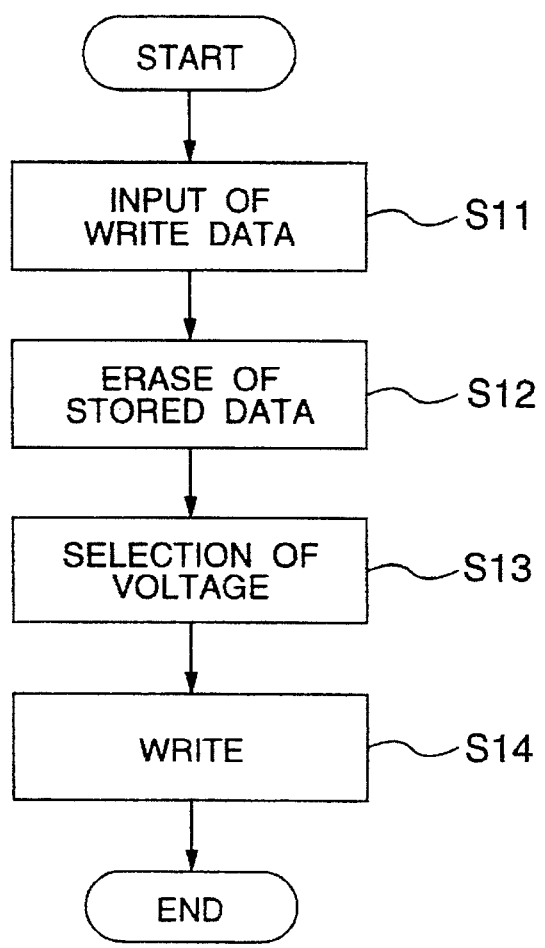
FIG. 4 is a flow chart showing the processing of data rewrite in the flash memory shown in FIG. 1.

Next, a method of rewriting the data stored in the memory cell 100 will be described with reference to a flow chart shown in FIG. 4.

Figure 5:
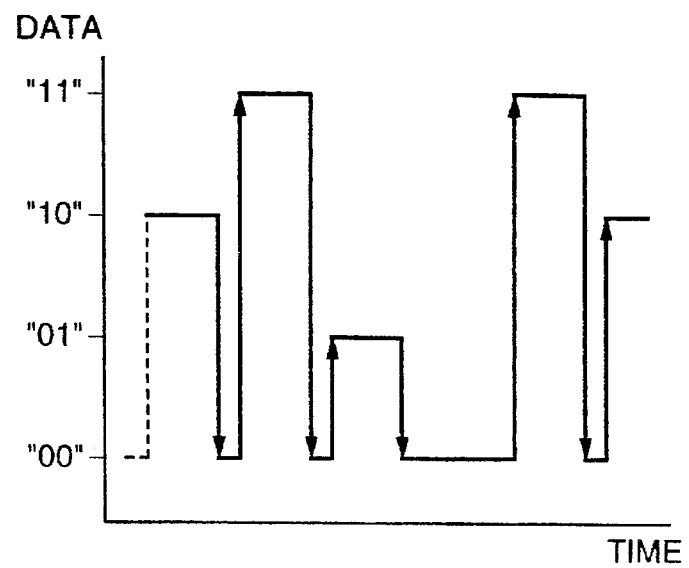
FIG. 5 is a graphical representation showing the concept of a data rewrite method in the flash memory shown in FIG. 1.

As an example, an instance will be described in which data "10" stored in the memory cell 100 is rewritten to data "11". When the write data "11" is inputted to the program control circuit 58 (step S11), the program control circuit 58 once erases the data "10" stored in the memory cell 100 in accordance with the erase method described above (step S12). Thereafter, the program control circuit 58 controls the high voltage generating circuit 57 to ground the bit line 105 of the memory cell 100, open the source line 106 of the memory cell 100 and apply a pulse voltage of about 10 to 15 volts to the control gate 110 of the memory cell 100 through the word line 111 (step S13). Through this, the write data "11" is written in the memory cell 100 in accordance with the aforementioned write method (step S14). In this manner, rewrite of data stored in the memory cell 100 is carried out by erasing once the data stored in the memory cell 100 and then writing the write data in the memory cell 100. Sequence of rewriting the data stored in the memory cell 100 in order of "10", "11", "01", "00", "11" and "10" is shown in FIG. 5.

The above description has been given for storage of quaternary (namely, 2-bit) data in one memory cell but when quaternary or more data is stored, rewrite of data can be effected in a similar manner.

Figure 6:
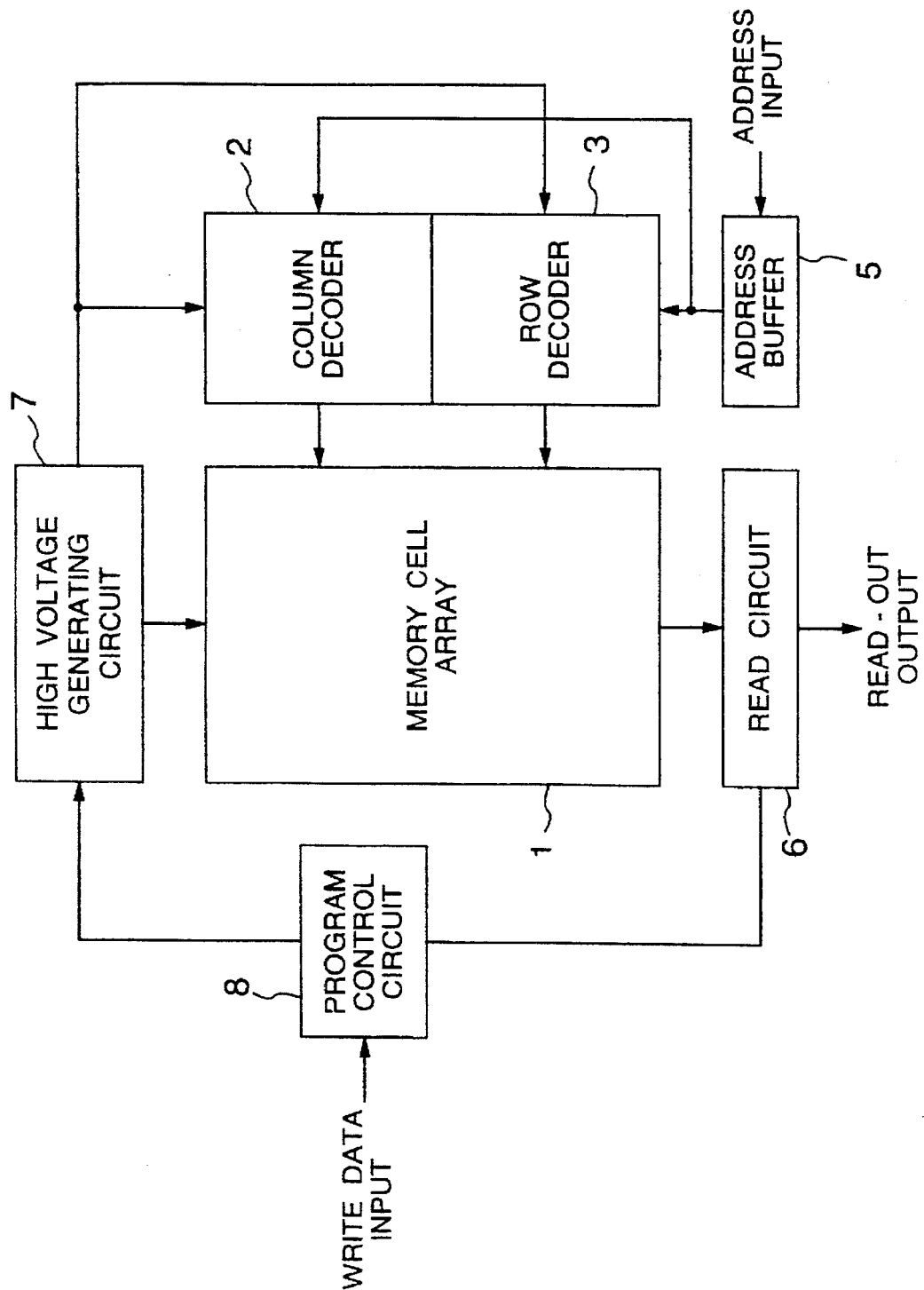
FIG. 6 is a block diagram showing the construction of a floating gate type flash memory according to a second embodiment of a non-volatile semiconductor memory unit of the present invention.

Referring to FIG. 6, a floating gate type flash memory according to a second embodiment of a non-volatile semiconductor memory unit of the present invention comprises a memory cell array 1, a column decoder 2, a row decoder 3, an address buffer 5, a read circuit 6 (detecting means), a program control circuit 8 and a high voltage generating circuit 7. In the memory cell array 1, memory cells 100, each being of the type which is illustrated in FIGS. 2 and 3, are arranged in matrix. The high voltage generating circuit 7 generates voltages to be applied to the bit line 105, source line 106 and word line 111 of the memory cell 100, respectively. The row decoder 3 selects the word line 111 of the memory cell array 1 in accordance with an address input supplied through the address buffer 5 and applies the voltage from the high voltage generating circuit 7 to the selected word line 111. The column decoder 2 selects the bit line 105 of the memory cell array 1 in accordance with the address input supplied through the address buffer 5 and applies the voltage from the high voltage generating circuit 7 to the selected bit line 105. The source line 106 of each memory cell 100 is applied with the voltage from the high voltage generating circuit 7. The read circuit 6 reads storage data of a selected memory cell 100 in the memory cell array 1; and in the read mode, it reads out and delivers the read storage data as a read-out output; and in the rewrite mode, it supplies the read storage data to the program control circuit 8. The program control circuit 8 compares the storage data supplied from the read circuit 6 with write data externally supplied and controls the high voltage generating circuit 7 in accordance with the result of the comparison to to generate voltages which are applied to the bit line 105, source line 106 and word line 111 of the selected memory cell 100, respectively. The high voltage generating circuit 7 generates the aforementioned voltages under the control of the program control circuit 8 and supplies them to the row decoder 3, the bit line 105 of the memory cell array 1 and the column decoder 2, respectively.

The row decoder 3 also responds to the output signal of the high voltage generating circuit 7 to ground the selected word line 111. The column decoder 2 also responds to the output signal of the high voltage generating circuit 7 to open the selected bit line 105. Under the control of the program control circuit 8, the high voltage generating circuit 7 also opens the source line 106 of each memory cell 100.

Figure 7:
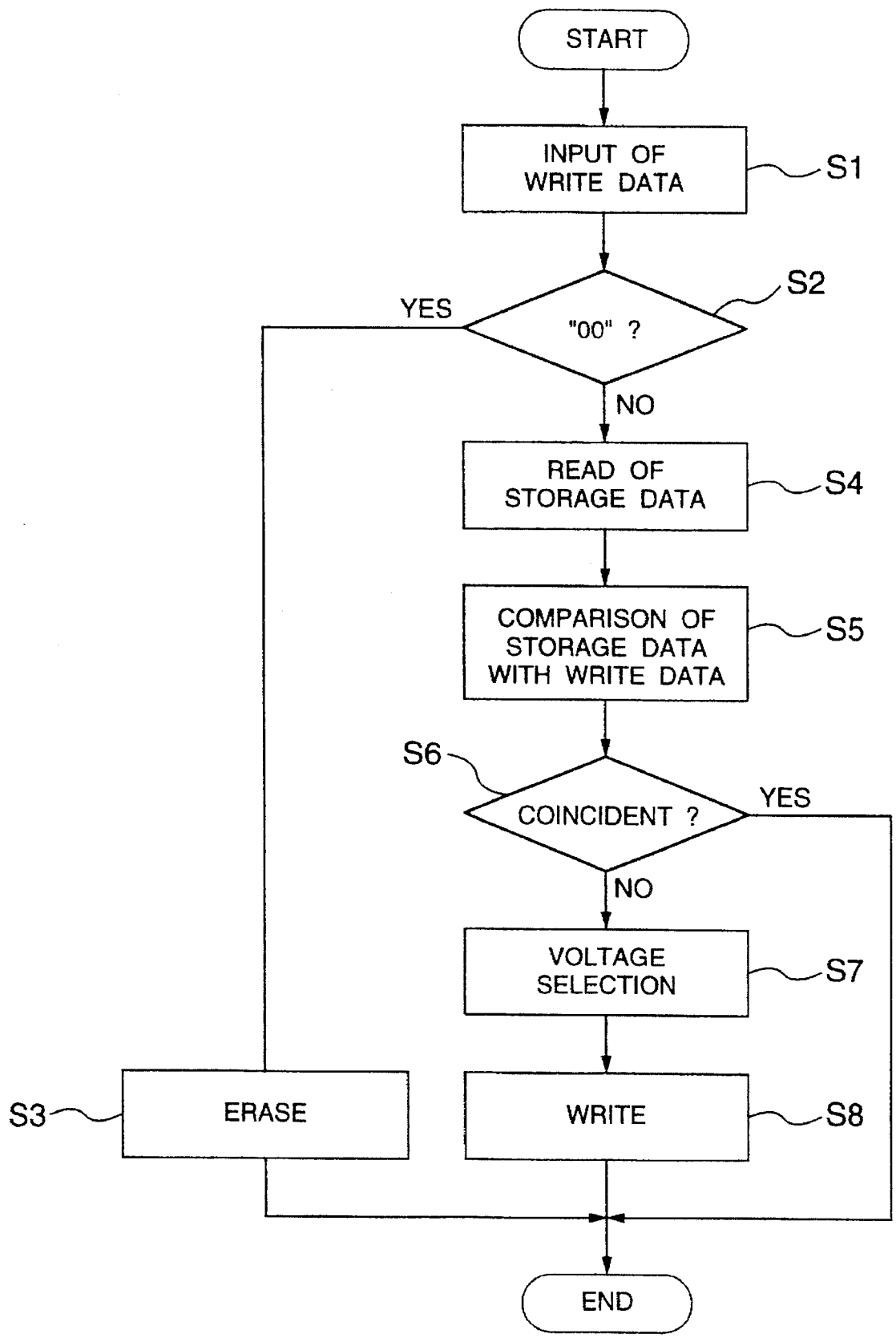
FIG. 7 is a flow chart showing the processing of data rewrite in the flash memory shown in FIG. 6.

Next, data rewrite operation in the flash memory will be described with reference to a flow chart shown in FIG. 7, on the assumption that quaternary (2-bit) data pieces "00" to "11" have been stored in each memory cell 100.

When a write data is inputted from the outside to the program control circuit 8 (step S1), the program control circuit 8 decides whether the write data is "00" (step S2). If the write data is "00", the data stored in the memory cell 100 subject to data rewrite is erased regardless of the contents of the data stored in this memory cell 100 (step S3). The erase operation is carried out as in the case of the flash memory shown in FIG. 1. More particularly, the program control circuit 8 controls the high voltage generating circuit 7 to ground the word line 111 (control gate 110) of the memory cell 100 subject to data rewrite through the row decoder 3, open the bit line 105 through the column decoder 2 and apply a pulse of high voltage (12 volts) to the source line 106. Through this, electric charge is drawn out of the floating gate 108 of the memory cell 100 subject to data rewrite under the influence of FN tunnelling to bring the memory cell 100 into electrical erase level ("00").

When the write data is other than "00", the storage data stored in the memory cell 100 subject to data rewrite is read by the read circuit 6 (step S4). The read storage data is sent from the read circuit 6 to the program control circuit 8 and subsequently compared with the write data by means of the program control circuit 8 (step S5). If the result of the comparison indicates that the storage data coincides with the write data (that is, if the write state of the memory cell 100 subject to data rewrite remains unchanged before and after rewrite), rewrite operation is not needed and the processing ends (step S6).

On the other hand, if the result of the comparison in step S5 indicates that the storage data differs from the write data (that is, if the storage state before rewrite of the memory cell 100 subject to data rewrite changes from the storage state after rewrite), the program control circuit 8 determines, on the basis of the comparison result, a combination of voltages (inclusive of ground and open) applied to the source (source line 106), drain (bit line 105) and control gate 110 (word line 111), respectively. There are nine combinations of voltages corresponding to combinations of storage states before and after rewrite (combinations of storage states before rewrite with those after rewrite) of the memory cell 100 subject to data rewrite which are "00"→"01", "00"→"10", "00"→"11", "01"→"10", "01"→"11", "10"→"01", "10"→"11", "11"→"01" and "11"→"10".

When the write data is larger than the storage data, that is, when of the above nine voltage combinations, six combinations corresponding to storage states before and after rewrite of the memory cell 100 subject to data rewrite which are "00"→"01", "00"→"10", "00"→"11", "01"→"10", "01"→"11" and "10"→"11" are taken, rewrite operation is carried out in which electric charge of amounts corresponding to the six combinations, respectively, are injected to the floating gate 108 of the memory cell 100 subject to data rewrite to raise the threshold value of this memory cell 100 by predetermined amounts (step S8). This rewrite operation is executed by causing the high voltage generating circuit 7 to open the source line 106 of the memory cell 100 subject to data rewrite, apply a pulse voltage of about 10 to 15 volts having a pulse width of 10 to 100 msec. to the word line 111 connected to the control gate 110 of this memory cell 100 and apply voltages indicated in Table 1 to the bit line 105 connected to the drain 102 of this memory cell 100.

TABLE 1

| Application Voltage to Bit Line 105 | | |
|---|---|---|
| Storage data | Write data | Application voltage to bit line 105 |
| "00" | "01" | 2 volts |
| "00" | "10" | 1 volt |
| "00" | "11" | 0 volt |
| "01" | "10" | 2 volts |
| "01" | "11" | 1 volt |
| "10" | "11" | 2 volts |

The levels of the voltages applied to the bit line 105 are determined based on a difference electric charge amount between an electric charge amount which the floating gate 108 accumulates before data rewrite and an electric charge amount to be accumulated after data rewrite.

The rewrite operation may also be executed by causing the high voltage generating circuit 7 to open the source line 106 of the memory cell 100 subject to data rewrite, apply a voltage of 0 volt to the bit line 105 connected to the drain 102 of this memory cell 100 and apply a pulse voltage of a pulse width of 10 msec. indicated in Table 2 to the word line 111 connected to the control gate 110 of this memory cell 100.

TABLE 2

Voltage of Pulse Applied to Word Line 111

| Storage data | Write data | Voltage of applied pulse |
|---|---|---|
| "00" | "01" | 10 volts |
| "00" | "10" | 12 volts |
| "00" | "11" | 15 volts |
| "01" | "10" | 10 volts |
| "01" | "11" | 12 volts |
| "10" | "11" | 10 volts |

Alternatively, the rewrite operation may be effected by causing the high voltage generating circuit 7 to open the source line 106 of the memory cell 100 subject to data rewrite, apply a voltage of 0 volt to the bit line 105 connected to the drain 102 of this memory cell 100 and apply a voltage of 12 volts having pulse widths indicated in Table 3 to the word line 111 connected to the control gate 110 of this memory cell 100.

TABLE 3

Pulse Width of Pulse Applied to Word Line 111

| Storage data | Write data | Pulse width of applied pulse |
|---|---|---|
| "00" | "01" | 5 msec |
| "00" | "10" | 10 msec |
| "00" | "11" | 50 msec |
| "01" | "10" | 5 msec |
| "01" | "11" | 10 msec |
| "10" | "11" | 5 msec |

On the other hand, in instances in which the write data is smaller than the storage data, that is, three of the aforementioned nine voltage combinations indicative of storage states before and after rewrite of the memory cell 100 subject to data rewrite occur which are "10"→"01", "11"→"01" and "11"→"10", rewrite operation is carried out in which amounts of electric charge corresponding to the aforementioned three combinations, respectively, are drawn out of the floating gate 108 of the memory cell 100 subject to data rewrite to lower the threshold value of this memory cell 100 by predetermined amounts (steps S7 and S8). This rewrite operation is an altered form of the erase operation and is effected by causing the high voltage generating circuit 7 to open the bit line 105 connected to the drain 102 of the memory cell 100 subject to data rewrite, apply a voltage indicated in Table 4 to the word line 111 connected to the control gate 110 of this memory cell 100 and apply a high voltage pulse of 12 volts having a pulse width of 100 msec. to the source line 106 of this memory cell 100.

TABLE 4

Application Voltage to Word Line 111

| Storage data | Write data | Application voltage to word line 111 |
|---|---|---|
| "10" | "01" | 2 volts |
| "11" | "01" | 1 volt |
| "11" | "10" | 2 volts |

The program control circuit 8 selects a combination in question from the aforementioned 9 (=6+3) voltage combinations to control the high voltage generating circuit 7 so as to cause it to generate requisite voltages. The voltages are used to perform the write processing of the memory cell described as above. Data indicative of the aforementioned nine voltage combinations are prepared in the form of a table which is stored in a relatively simple memory (not shown) such as a mask ROM formed on the same chip, for example.

Figure 8:
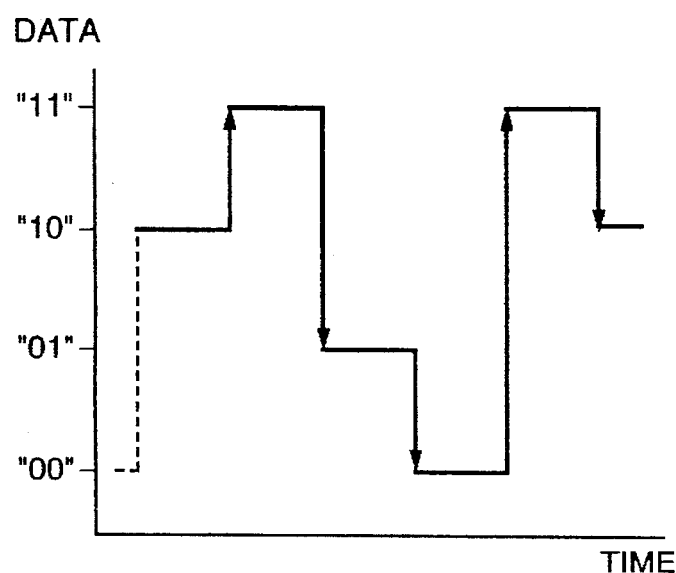
FIG. 8 is a graphical representation showing the concept of a data rewrite method in the flash memory shown in FIG. 6.

FIG. 8 shows sequence of rewrite according to the present embodiment in order of "10"→"11"→"01"→"00"→"11"→"10" as explained with reference to FIG. 5, indicating that in the present embodiment, erase to "00" is not carried out except when rewrite to "00" is effected and previous data is rewritten directly to succeeding data. Accordingly, while in the unit shown in FIG. 1 current passes through the tunnel insulating film 107 of the memory cell 100 shown in FIG. 1 at the time that previous data is erased to "00" as well as succeeding data is written. Consequently, the amount of current passing through the tunnel insulating film 107 increases, only an amount of current necessary for rewriting previous data to succeeding data passes through the tunnel insulating film 107 in the unit of the present embodiment. Accordingly, in the unit of the present embodiment, deterioration of the tunnel insulating film 107 can be decreased drastically, leading to an advantage that the number of rewrite operations can be increased remarkably.

The present invention is in no way limited to the embodiments set forth so far. For example, each memory cell is described as storing quaternary (2-bit) data in the foregoing embodiments but the present invention can be applied to the case where tertiary data or quinary or more data is stored in each memory cell.

Figure 9:
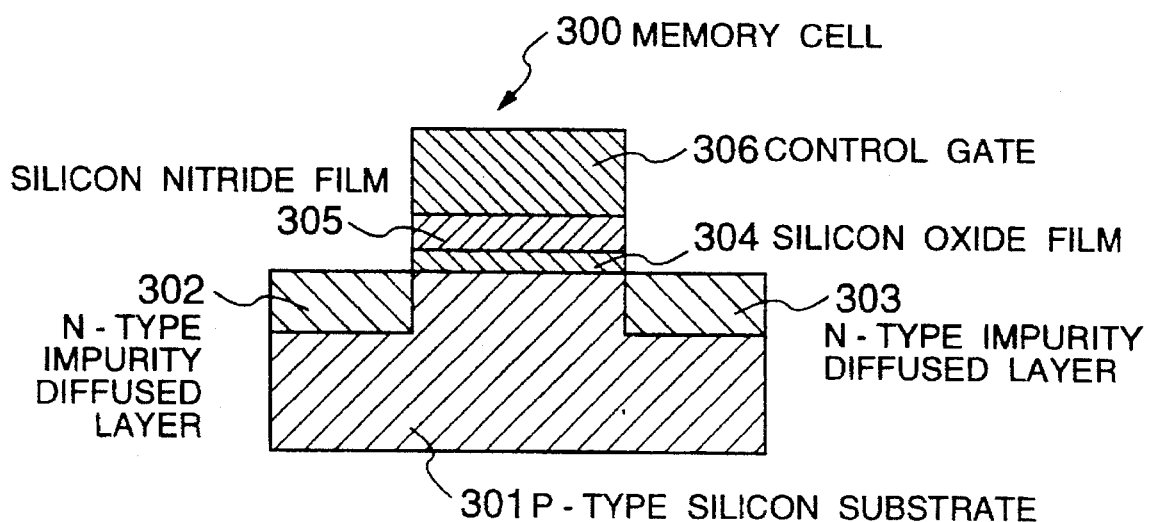
FIG. 9 is a schematic sectional view showing a memory cell of MNOS structure.

In the foregoing embodiment, the electric charge accumulative layer of each memory cell 100 has been described as being the floating gate 108, but the present invention can also be applied to a non-volatile semiconductor memory unit of multi-value level type having a memory cell 300 of an MNOS structure in which the electric charge accumulative layer is a boundary face between a silicon oxide film 304 and a silicon nitride film 305 as shown in FIG. 9. The memory cell 300 of the MNOS structure comprises a P-type silicon substrate 301, an N-type impurity diffused layer 302 (source) and an N-type impurity diffused layer 303 (drain) which are formed in the P-type silicon substrate 301, the silicon oxide film 304 formed on the surface of the P-type silicon substrate 301 at a portion of channel region between the N-type impurity diffused layers 302 and 303, the silicon nitride film 305 formed on the silicon oxide film 304 and a control gate 306 formed on the silicon nitride film 305.

What is claimed is:

1. A non-volatile semiconductor memory unit comprising:

a memory cell having a semiconductor substrate, a control gate formed over said semiconductor substrate, an electric charge accumulative layer formed between said semiconductor substrate and said control gate, and a source and drain both of which are formed in said semiconductor substrate, said memory cell storing tertiary or more data by accumulating electric charge in said electric charge accumulative layer;

detection means for detecting a storage state before data rewrite of said memory cell;

comparison means for comparing the storage state before data rewrite, which is detected by said detection means, with a storage state after data rewrite to produce a difference between the storage state before data rewrite and said storage state after data rewrite; and rewrite means for rewriting the storage state of said memory cell by applying predetermined voltages to said source, said drain and said control gate of said memory cell, respectively, in accordance with the difference produced in said comparison means.

2. A non-volatile semiconductor memory unit according to claim 1, wherein said electric charge accumulative layer is a boundary face between an oxide film and a nitride film.

3. A non-volatile semiconductor memory unit according to claim 3, wherein said rewrite means comprises change means for changing the application time of each of said predetermined voltages.

4. A non-volatile semiconductor memory unit according to claim 3, wherein said change means changes the application time of said predetermined voltage to be applied to said control gate.

5. A non-volatile semiconductor memory unit according to claim 1, wherein said detection means comprises means for measuring an amount of electric charge accumulated in said electric charge accumulative layer.

6. A non-volatile semiconductor memory unit according to claim 1, wherein a value of said predetermined voltage to be applied to said control gate is rendered to be constant for increment of data step by one unit.

7. A method of rewriting a non-volatile semiconductor memory unit, said non-volatile semiconductor memory unit comprising a memory cell which has a semiconductor substrate, a control gate formed over said semiconductor substrate, an electric charge accumulative layer formed between said semiconductor substrate and said control gate, and a source and drain both of which are formed in said semiconductor substrate, said memory cell storing tertiary or more data by accumulating electric charge in said electric charge accumulative layer;

said method comprising said steps of:

detecting a storage state before data rewrite of said memory cell;

comparing the storage state before data rewrite, which is detected by said detecting step, with a storage state after data rewrite to produce a difference between the storage state before data rewrite and the storage state after data rewrite; and rewriting the storage state of said memory cell by applying predetermined voltages to said source, said drain and said control gate of said memory cell, respectively, in accordance with said produced difference.

8. A method according to claim 7, wherein said electric charge accumulative layer is a boundary face between an oxide film and a nitride film.

9. A method according to claim 7, wherein said rewriting step comprises a step of changing the application time of each of said predetermined voltages.

10. A method according to claim 9, wherein said changing step of changes the application time of said predetermined voltage to be applied to said control gate.

11. A method according to claim 7, wherein said detecting step comprises a step of measuring an amount of electric charge accumulated in said electric charge accumulative layer.

12. A method according to claim 7, wherein a value of said predetermined voltage to be applied to said control gate is rendered to be constant for increment of data step by one unit.

13. A non-volatile semiconductor memory unit comprising:

a memory cell having a semiconductor substrate, a control gate formed over said semiconductor substrate, an electric charge accumulative layer formed between said semiconductor substrate and said control gate, and a source and drain, both formed in said semiconductor substrate, said memory cell storing N-valued data (N being an integer more than 3) by accumulating electric charge in said electric charge accumulative layer;

detection means for detecting a storage state before data rewrite of said memory cell;

comparison means for comparing the storage state before data rewrite, which is detected by said detection means, with a storage state after data rewrite to produce a difference between the storage state before data rewrite and the storage state after data rewrite; and rewrite means for rewriting the storage state of said memory cell by applying N−1 levels of predetermined voltages to said source, said drain and said control gate of said memory cell, respectively, in accordance with the difference produced in said comparison means.

14. A non-volatile semiconductor memory unit according to claim 13, wherein said electric charge accumulative layer is a boundary face between an oxide film and a nitride film.

15. A non-volatile semiconductor memory unit according to claim 13, wherein said rewrite means comprises change means for changing the application time of each of said N−1 levels of predetermined voltages.

16. A non-volatile semiconductor memory unit according to claim 15, wherein said change means changes the application time of said N−1 levels of predetermined voltages to be applied to said control gate.

17. A non-volatile semiconductor memory unit according to claim 13, wherein said detection means comprises means for measuring an amount of electric charge accumulated in said electric charge accumulative layer.

18. A non-volatile semiconductor memory unit according to claim 13, wherein voltage values of said N−1 levels of predetermined voltages to be applied to said control gate are rendered to be constant for increment of data step by one unit.

19. A method of rewriting a non-volatile semiconductor memory unit, said non-volatile semiconductor memory unit comprising a memory cell which has a semiconductor substrate, a control gate formed over said semiconductor substrate, an electric charge accumulative layer formed between said semiconductor substrate and said control gate, and a source and drain both of which are formed in said semiconductor substrate, said memory cell storing N-valued data (N being an integer more than 3) by accumulating electric charge in said electric charge accumulative layer;

said method comprising the steps of:

detecting a storage state before data rewrite of said memory cell;

comparing the storage state before data rewrite, which is detected by said detecting step, with a storage state after data rewrite to produce a difference between the storage state before data rewrite and the storage state after data rewrite; and rewriting the storage state of said memory cell by applying N−1 levels of predetermined voltages to said source, said drain and said control gate of said memory cell, respectively, in accordance with said produced difference.

20. A method according to claim 19, wherein said electric charge accumulative layer is a boundary face between an oxide film and a nitride film.

21. A method according to claim 19, wherein said rewriting step comprises a step of changing the application time of each of said N−1 levels of predetermined voltages.

22. A method according to claim 21, wherein said changing step changes the application time of said N−1 levels of predetermined voltages to be applied to said control gate.

23. A method according to claim 19, wherein said detecting step comprises a step of measuring an amount of electric charge accumulated in said electric charge accumulative layer.

24. A method according to claim 19, wherein values of said N-1 levels of predetermined voltages to be applied to said control gate are rendered to be constant for increment of data step by one unit.

25. A non-volatile semiconductor memory unit comprising:

a memory cell having a semiconductor substrate, a control gate formed over said semiconductor substrate, an electric charge accumulative layer formed between said semiconductor substrate and said control gate, and a source and drain, both formed in said semiconductor substrate, said memory cell storing N-valued data (N being an integer more than 3) by accumulating electric charge in said electric charge accumulative layer;

detection means for detecting a storage state before data rewrite of said memory cell;

comparison means for comparing the storage state before data rewrite, which is detected by said detection means, with a storage state after data rewrite to produce a difference between the storage state before data rewrite and the storage state after data rewrite; and rewrite means for rewriting the storage state of said memory cell by applying predetermined voltages to said source, said drain and said control gate of said memory cell, respectively, each of said predetermined voltages having a voltage value which is determined among N-1 of voltage values in accordance with the difference produced in said comparison means.

26. A method of rewriting a non-volatile semiconductor memory unit, said non-volatile semiconductor memory unit comprising a memory cell which has a semiconductor substrate, a control gate formed over said semiconductor substrate, an electric charge accumulative layer formed between said semiconductor substrate and said control gate, and a source and drain, both formed in said semiconductor substrate, said memory cell storing N-valued data (N is an integer more than 3) by accumulating electric charge in said electric charge accumulative layer;

said method comprising said steps of:

detecting a storage state before data rewrite of said memory cell;

comparing the storage state before data rewrite, which is detected in said detecting step, with a storage state after data rewrite to produce a difference between the storage state before data rewrite and the storage state after data rewrite; and rewriting the storage state of said memory cell by applying predetermined voltages to said source, said drain and said control gate of said memory cell, respectively, each of said predetermined voltages having a voltage value which is determined among N-1 of voltage values in accordance with the difference produced in said comparison means.

27. A non-volatile semiconductor memory unit including a memory cell having a semiconductor substrate, a control gate formed over said semiconductor substrate, an electric charge accumulative layer formed between said semiconductor substrate and said control gate, and a source and drain, both formed in said semiconductor substrate, said memory cell storing N-valued data (N being an integer more than 3) by accumulating electric charge in said electric charge accumulative layer, comprising:

data erase means for erasing data stored in said memory cell; and rewrite means for rewriting a storage state of said memory cell by applying predetermined voltages, which correspond to a value of said N-valued write data, to said source, said drain and said control gate of said memory cell, respectively, at which said stored data is erased by said data erase means, each of said predetermined voltages having a voltage value which is determined among N-1 of voltage values in accordance with the difference produced in said comparison means.

* * * * *